United States Patent [19]

Poumakis

[11] Patent Number: 4,841,209
[45] Date of Patent: Jun. 20, 1989

[54] ACTUATOR CONTROL SYSTEM WITH DISPLACEMENT SENSOR FAULT DETECTION

[75] Inventor: Demetrius J. Poumakis, West Paulm Beach, Fla.

[73] Assignee: United Technologies Corporation, Hartford, Conn.

[21] Appl. No.: 125,364

[22] Filed: Nov. 25, 1987

[51] Int. Cl.$^4$ .............................................. G05B 9/03
[52] U.S. Cl. .................................. 318/564; 336/136; 328/71; 364/184
[58] Field of Search ........................ 318/564; 336/136; 328/71; 364/184

[56] References Cited

U.S. PATENT DOCUMENTS

| | | | |
|---|---|---|---|
| 4,134,065 | 1/1979 | Bauer et al. | 318/653 X |
| 4,297,698 | 10/1981 | Pauwels et al. | 340/870.32 |
| 4,560,938 | 12/1985 | Poumakis | 328/71 |
| 4,598,355 | 7/1986 | Shepler et al. | 364/184 |

*Primary Examiner*—William M. Shoop, Jr.
*Assistant Examiner*—Saul M. Bergmann
*Attorney, Agent, or Firm*—McCormick, Paulding & Huber

[57] ABSTRACT

A novel actuator control system is characterized by displacement sensor fault detection. The system includes linear variable phase transducer (LVPT) displacement sensors. A pair of engine electronic controls (EEC) each determines the actuator position by measuring the phase shift of the corresponding LVPT output signal with respect to the fixed phase of the LVPT excitation signal. The voltage amplitude of the LVPT output signal has a unique relationship with to the phase of the excitation signal, and is more sensitive to sensor failure than is phase shift alone. A computer in the control compares the amplitude of the LVPT output signal to upper and lower voltage limits for that displacement. Should the computer determine that the voltage amplitude of the secondary winding output signal is out of range, the system will adjust the actuator drive circuits accordingly.

4 Claims, 6 Drawing Sheets

ACTUATOR CONTROL SYSTEM WITH DISPLACEMENT SENSOR FAULT DETECTION

This invention was made under a Government contract and the Government has rights therein.

TECHNICAL FIELD

This invention relates to displacement sensor fault detection in an engine control system and more particularly to systems characterized by fault detection of a linear variable phase transducer (LVPT) displacement sensor.

BACKGROUND OF THE INVENTION

Aircraft engine control systems employ a number of feedback sensors to accomplish closed loop control of engine actuators. For linear displacement engine components, such as a nozzle actuator, a linear displacement sensor is needed to generate a feedback signal so that engine electronic control (EEC) systems can reliably determine the actuator position.

Known EEC systems have incorporated a variety of analog or digital displacement sensors. Two analog sensors are the linear variable differential transducer (LVDT), and the linear variable phase transducer (LVPT). A LVDT displacement sensor produces an output signal whose output voltage magnitude varies as a function of displacement. In contrast, a LVPT displacement transducer generates an output signal whose phase, rather than magnitude, is modulated as a function of displacement. An example of a linear variable phase transducer is disclosed in U.S. Pat. No. 4,134,065.

Since the output signal of an LVPT sensor is not amplitude based, it possesses several potential advantages over an LVDT sensor in a control system, including greater accuracy over varying temperatures, and it requires simpler, less costly electronics for implementation.

An LVPT is characterized by primary windings or coils which are energized by alternating current sources having 90° of phase separation. Encompassed by the primary coils or windings is a core which moves with the actuator stroke. The magnetic flux produced by the primary coils is summed in the displaceable core in proportion to the cores position with respect to the primary coils, producing an output voltage across a secondary coil whose phase is shifted with respect to a primary coil excitation signal.

Some existing systems which employ a LVPT have a coarse capability of monitoring the transducer for feedback sensor failure. Since the voltage amplitude of the LVPT is approximately constant, a substantial change in the voltage across the secondary coil can be sensed as an indication of LVPT failure. However, it has been determined that the voltage amplitude across the secondary coil is not sufficiently constant to provide an indication of transducer failure for high precision applications, such as a displacement sensor within an aircraft engine actuator. Moreover, existing displacement feedback fault detection systems cannot discriminate between various types of faults. These LVPT faults or failures include loss of LVPT excitation signals, a primary or secondary coil open circuit, or full or partial primary or secondary short circuit. For high precision applications in aircraft engines, it is critical that the control system quickly and accurately determine if there has been a displacement feedback sensor failure.

SUMMARY OF INVENTION

An object of the present invention is to provide for a displacement sensor fault detection system for use with a linear variable phase transducer which detects transducer failure as a function of output voltage amplitude.

According to the present invention, a detection system for determining failure of a linear variable phase transducer (LVPT) displacement feedback sensor, which includes a plurality of electrical windings for producing alternating magnetic fluxes at different respective phases, and which includes a displaceable core and a secondary electrical winding providing signals indicative of the sum of the magnetic flux in the core, the system comprising an apparatus for sensing the relative phase of the primary winding excitation signals as well as a means for sensing the voltage and phase of the signals induced in the secondary winding. A detector receives the sensed signals and includes apparatus for determining the relative phase magnitude between the primary excitation signal and the secondary winding signal. A computer determines the value of the sensor displacement in dependence on the relative phase magnitude. A comparator is also included which compares the secondary winding signal voltage value with a predetermined range secondary winding signal values, corresponding to the displacement signal value. The comparator provides fault signals if the secondary winding signal voltage value is not within the secondary winding voltage range corresponding to that displacement.

According to another aspect of the present invention, a dual system for controlling an actuator includes first and second electronic controls each of which has an actuator driver that is responsive to external controls for displacing the actuator along an axis. A displacement sensor means is included with each electronic control configured with its respective actuator driver. The displacement sensor measures the magnitude of the actuator displacement and includes a linear variable phase transducer having a plurality of electrical windings for producing magnetic fluxes at different phases in a displacable core. The linear variable phase transducer comprises a secondary electrical winding which provides signals indicative of the summed magnetic flux in the core. A displacement sensor failure means is included for determining the occurrence of a displacement sensor failure. The displacement sensor failure means includes means for sensing the primary winding excitation signal, means for sensing voltage and phase of the secondary winding signal, and means for detecting these sensed signals and for determining relative phase magnitude between the primary winding excitation signal and the secondary winding signals. A computer is included to generate displacement signal values in dependence on each of the relative phase magnitudes. A comparator compares each secondary winding signal voltage value with a predetermined range of values corresponding to the displacement signal magnitude and provides a false signal disabling the actuator driver if the secondary winding signal voltage value is not within the displacement value range. The system also includes a means for configuring the non-disabled one of said actuator drivers to allow normal operation of the actuator.

DESCRIPTION OF THE PREFERRED EMBODIMENTS

Figure 1:
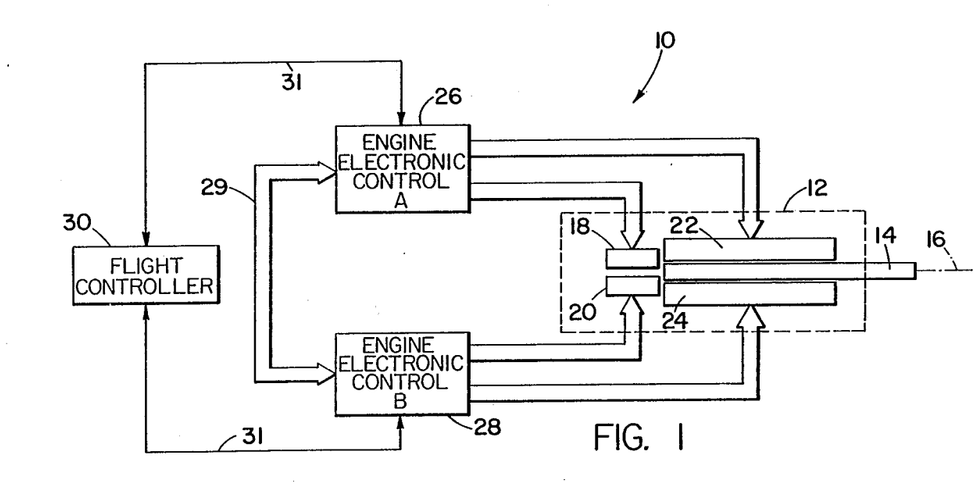
FIG. 1 is a simplified block diagram illustrating an actuator control system having a displacement sensor fault detection system according to the present invention.

Referring now to FIG. 1 there is shown in a simplified block diagram, an actuator control system 10 used as part of an aircraft engine control system. The control system 10 includes a plurality of linear actuators, such as actuator 12 having an element 14 displaceable along an axis 16. These actuators are hydraulic actuators and include servovalve torque motors 18 and 20 for servo control of the actuator 12. For each actuator there are two displacement feedback sensors, such as displacement feedback sensors 22 and 24. These sensors each comprise a linear variable phase transducer (LVPT) and are detailed hereinafter with respect to FIG. 2.

The system 10 also includes an engine electronic control 26, 28 for each torque motor and sensor. As is conventional in an engine control system, each engine electronic control separately determines all of the engine parameters, such as fuel and air flow. In FIG. 1, only those functions related to actuator 12 are illustrated. Each engine electronic control provides phased excitation signals to the LVPT and receives therefrom an output signal which, as described hereinafter, is indicative of the actuator displacement. To displace the actuator, the engine electronic control will provide actuator drive signals to its corresponding torque motor. Fault logic circuitry in the engine electronic control determines the presence of a feedback sensor fault typically caused by a LVPT transducer failure. If a transducer failure has occurred, the corresponding engine electronic control depowers its torque motor and provides signals on lines 29 indicative of the sensor failure to the other electronic engine control, thus allowing proper control at the actuator by the other engine control. Flight controller 30 receives on line 31 diagnostic signals from the engine electronic controls 26,28.

Figure 2:
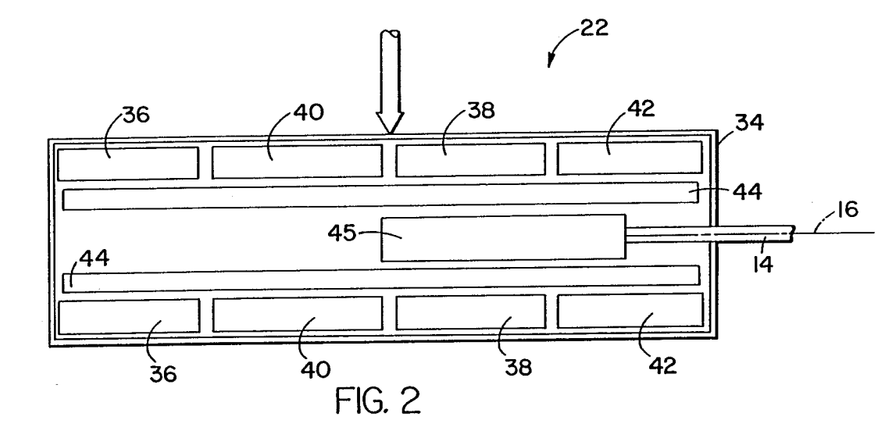
FIG. 2 is a simplified schematic illustration, in section, of a portion of a linear variable phase transducer (LVPT) used with the control system of FIG. 1.

Referring now to FIG. 2, there is illustrated, in section, a portion of the linear variable phase transducer (LVPT) of a displacement feedback sensor 22 of FIG. 1. The LVPT includes an outer housing 34 which encompasses a plurality of primary excitation windings, such as first and second sine windings 36, 38, and first and second cosine windings 40 and 42. Enclosed within the primary excitation windings is a secondary winding 44, which is disposed lengthwise within the LVPT and which encompasses a moveable core 45, comprised of copper or some high magnetic permeability material. The moveable core is displaceable about the actuator longitudinal axis 16 and is configured with the displacement element of the actuator, of which only a portion is shown.

A LVPT is a device which relates a variation in phase between primary and secondary winding signals to core displacement. An example of an LVPT is found in U.S. Pat. No. 4,134,065 and is incorporated herein by reference. The stroke or displacement of the moveable core produces a linear change in the phase relationship of the signal output from the secondary winding with respect to a winding excitation signal. Each engine electronic control includes a LVPT primary excitation signal source comprising dual sinusoidal current sources whose signals (sine and cosine) are 90° apart in phase but are otherwise identical. Although it is preferrable that the excitation signals be sinusoidal, those skilled in the art will recognize that an excitation signal could have a triangular, rectangular or other periodic waveform.

In the best mode embodiment, each excitation signal is received by two separate primary windings which are wound in opposite directions. In FIG. 2, second sine winding 38 and cosine winding 42 are oppositely wound from windings 36 and 40, respectively. The four excitation windings are stacked lengthwise along the displacement axis. In operation, the electromagnetic field produced by the cosine current source leads the field produced the sine current source windings by 90° due to the 90° phase shift of the excitation signal sources. The fields produced by the second sine and cosine windings lead the fields lead produced by the first sine and cosine windings, respectively, by 180° because they are oppositely wound. Therefore, the magnetic fields produced by current flow in the windings are progressively shifted by 90°, and the magnetic field within the moveable core is the vector sum of the individual magnetic field vectors produced by the respective excitation windings. The number and distribution of turns in each of the windings is selected using conventional techniques to induce a signal in the secondary winding whose voltage has a linear relationship to the core displacement with respect to the sine excitation signal.

The magnitude of the magnetic flux in the core is conventionally determined. However, the actual magnetic flux in the core is immaterial so long as it is sufficiently large to induce a signal in the secondary winding that is detectable by EEC circuitry associated with the LVPT.

Figure 3A:
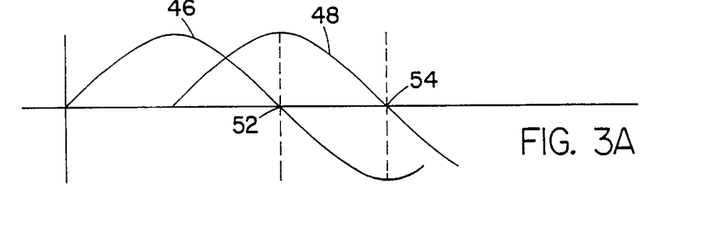
FIGS. 3a, 3b and 3c are simplied, diagramatic illustrations of signals found in the control system of FIG. 1.
Figure 3B:
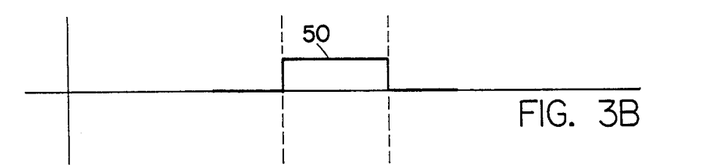
Figure 3C:
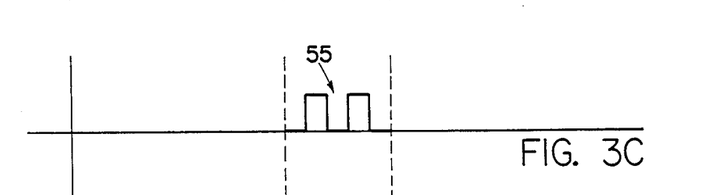

A signal is induced across the secondary winding whose voltage amplitude has one negative to positive zero crossing per excitation cycle. The temporal relationship between the primary sine excitation signal and that induced across the secondary winding can be seen with reference to FIG. 3a. The primary sine reference signal 46, is seen to lead the secondary winding signal 48. As detailed hereinafter phase detection circuitry provides to a counter associated therewith an enable signal (50 FIG. 3b), whose duration extends for the time between the primary excitation signal zero crossing 52 and that of the secondary signal 54. During this enable period, digital pulses (55 FIG. 3c) are accumulated in the counter. The number of accumulated pulses is directly proportional to the amount of phase difference between signals 46 and 48 and, therefore, directly indicates the amount of core displacement and also actuator position.

Figure 4:
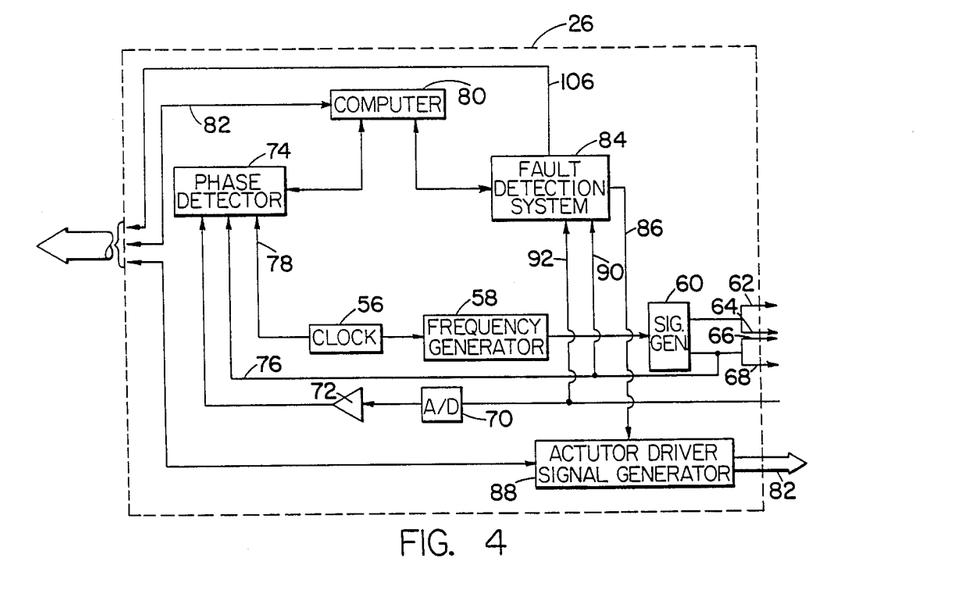
FIG. 4 is a block diagram illustrating a portion of an engine electronic control used with the control system of FIG. 1.

Referring now to FIG. 4, there is illustrated in block diagram format, a portion of the engine electronic control (EEC) 26 used with the control system 10 of FIG. 1. The electronic engine control includes a clock 56. A conventional sine/cosine signal generator 60 provides two fundamental excitation signals having the same frequency but different respective phases. As indicated hereinabove, each primary winding has two separate sections which are wound in opposite directions, producing four 90° phase shifted signals represented schematically by lines 62, 64, 66 and 68. Alternatively an AC signal or frequency-generator can be used to generate the sine and cosine excitation signals.

The signal output from the secondary winding is received on line 68 and is provided to a conventional signal conditioning circuitry, such as analog to digital (A/D) converter 70 and amplifier 72, before being provided to a digital phase detector 74. The detector receives signal on lines 76 as well as the sine excitation signal on lines 78 whose signal parameters are used as a reference signal by the phase detector circuitry, as described hereinabove. The digital phase detector may be of any conventional type, and in the best mode embodiment, comprises conventional zero crossing and comparator circuitry.

Referring again to FIGS. 3a, 3b and 3c, when the reference excitation signal undergoes a positive zero crossing, the digital phase detector enables clock pulses to be accumulated in the counter. Conventional circuitry included with the detector 74 subsequently halts the accumulation of clock pulses in the counter when the detector senses a secondary signal positive to negative zero crossing. The number of counts accumulated is proportional to the phase difference between the reference excitation signal and the secondary winding signal.

A computer 80 is included with each engine electronic control and has such conventional computational and memory means as is necessary to accommodate the functions described herein. The computer contains data in look up table format relating the number of counts measured with core displacement, and provides to the controller on line 82 signals indicative of the actuator displacement.

Also included in the engine electronic control, is a fault detection system 84, which senses LVPT displacement sensor failures as described hereinafter. If a sensor failure has been detected, the fault detection circuitry provide torque motor disable signals on lines 86 to actuator driver signal generator 88.

A fault detection system provided according to the present invention can detect several types of LVPT displacement sensor failures, including loss of excitation signals and primary or secondary winding open circuits. An open circuit or loss of excitation signal is detected by the fault detection system in a conventional manner by sensing the magnitude of current flow through a resister using a differential amplifier. The amplifier output signal is compared to a value just greater than zero. The fault detector system generates a diagnostic signal if an open circuit or loss of excitation signal has occurred.

The fault detection system receives signals indicative of the reference excitation signal and the secondary winding signal on lines 90 and 92 respectively. As indicated hereinabove, the voltage across the secondary winding has an amplitude which varies as a function of position. The shape of the amplitude function with core displacement is fairly constant for LVPT displacement sensors at the same stroke length. These variations may be due to the wire size, diameter, or the tension applied to the wire when the coils were first wound.

Figure 5:
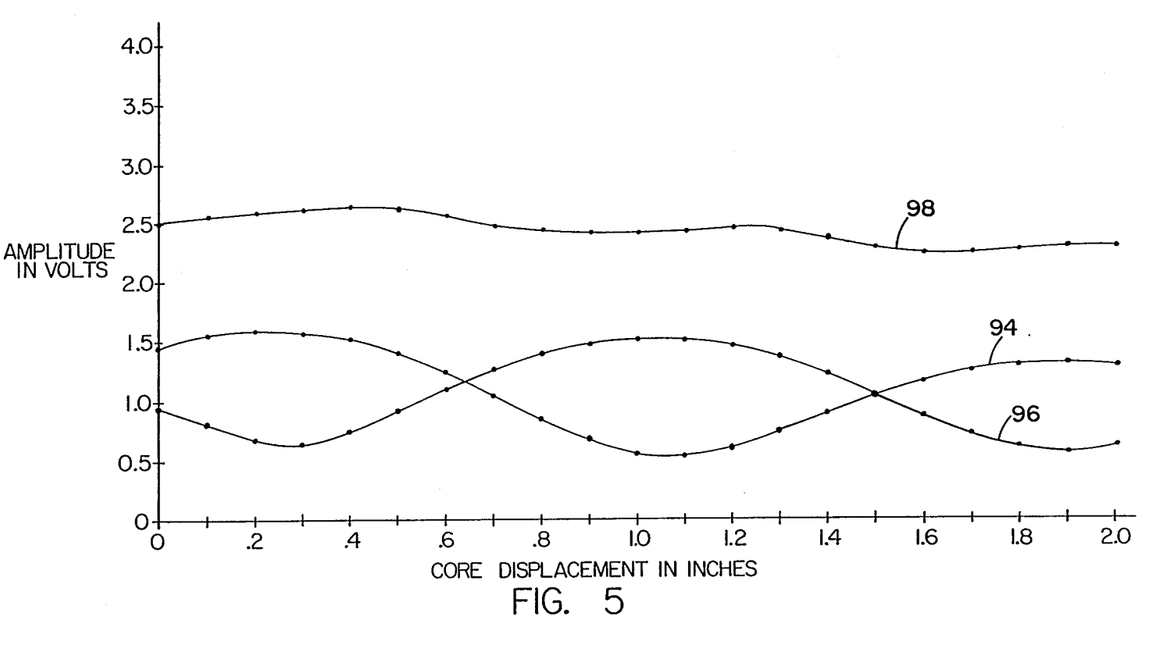
FIG. 5 is a diagramatic illustration of the relationship between amplitude and displacement of signals, generated by the transducer of FIG. 2.

FIG. 5 is a diagramatic illustration of the relationship between the core displacement and the amplitude of signals output from the transducer of FIG. 2. Signals 94 and 96 correspond to the voltage of the first primary (sine) and the second primary (cosine), excitation signals respectively. Signal 98 corresponds to the voltage across the secondary winding. It is clear from FIG. 5 that the voltage amplitude of the secondary winding is not constant over the range of core displacement. For a typical six inch stroke, a LVPT has a secondary winding signal whose voltage amplitude is modulated, with a minimum signal amplitude at 1 inch, 3.5 inches and 6 inches, while having a maximum signal amplitude at zero 2.5 inches and 4.5 inches.

Figure 6:
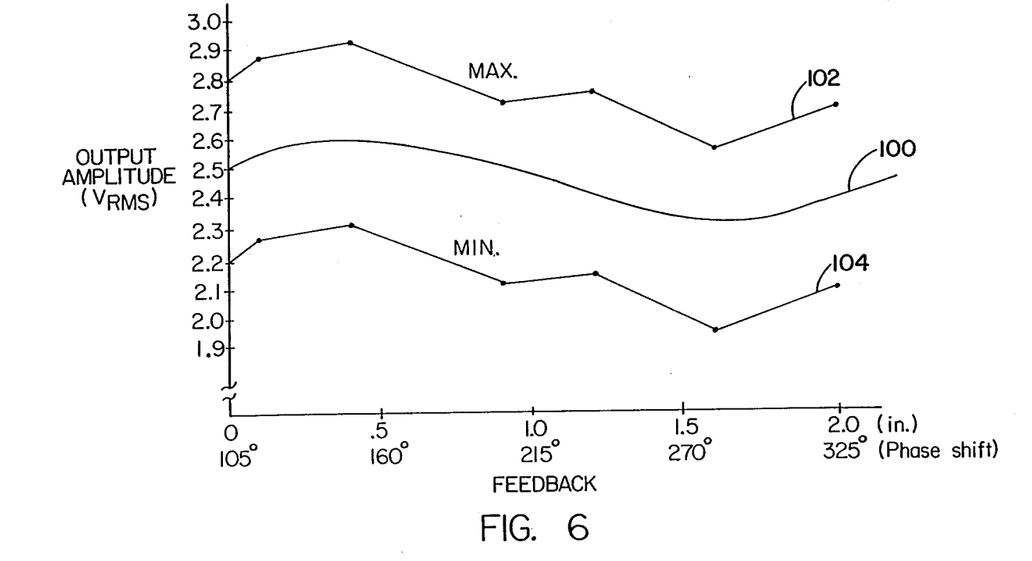
FIG. 6 is a diagramatic illustration showing the the range of acceptable secondary winding voltage amplitudes for a portion of the secondary winding signal of FIG. 5 as a function of displacement.

FIG. 6 is a diagramatic illustration showing the relationship between displacement (measured phase shift) and voltage amplitude for a portion of the secondary winding signal of FIG. 5. Since the voltage across the secondary winding is not constant with displacement (curve 100), the fault detection system cannot rely simply on a change in secondary winding voltage from an established constant value to indicate a failure. As illustrated in FIG. 6, for each displacement value there is a range of acceptable secondary winding voltage magnitudes per unit transducer displacement. The range maximums and minimums vary as a function of a displacement (curves 102 and 104, respectively). An acceptable voltage magnitude at 0.5 inches (e.g. 2.8 V) would be a proper indication of fault at 1.5 inches. Consequently, the fault detector system also includes means for storing data in look-up table format which correspond to acceptable minimum and maximum values of secondary winding voltage amplitude for each value of displacement. Once the computer generates a displacement value, the fault detector system identifies that value with the measured value of secondary winding voltage amplitude and selects the corresponding range of acceptable secondary winding voltage values. If a fault has occurred, the measured value of secondary winding voltage will lie outside the voltage range. Accordingly, the fault detection system will generate a failure signal on line 106 FIG. 4, and provide a disable signal on line 86 to actuator driver signal generator 88.

Once a sensor failure has occurred, the fault detection system provides a signal on lines 29 to the complementary engine electronic control (28 FIG. 1) indicative thereof and diagnostic signals to the flight controller. In response, the complementary engine electronic control is configured to allow continuted operation of the actuator.

Those skilled in the art will note that the displacement sensor fault detection system provided according to the present invention can be adapted to be used with a plurality of actuators with appropriate conventional adaptations in hardware and software dependent on the particular application. Similarly, although the invention has been shown and described with respect to a best mode embodiment thereof, it should be understood by those skilled in the art that various other changes and omissions and additions thereto may be made therein without departing from the spirit and scope of the invention.

I claim:

1. A detection system for use in determining failure of a linear variable phase transducer (LVPT) displacement sensor that includes a plurality of primary electrical windings receiving excitation signals for producing magnetic fluxes at different phases in a displaceable core, and a secondary electrical winding providing signals indicative of the summed magnetic flux in the core, said system comprising:
   means for sensing said primary winding excitation signals;
   means for sensing voltage and phase of the secondary winding signals;
   detector means for receiving said sensed signals including;
   means for determining a magnitude of the relative phase between said primary excitation signals and said secondary winding signals;
   means for computing a displacement signal value in dependence on said relative phase magnitude; and
   means having associated therewith a plurality of predetermined ranges of signal values corresponding to each of said displacement signal values for comparing the secondary winding signal voltage value with the corresponding one of said predetermined ranges of signal values, said comparing means capable of formulating each of said value ranges with different magnitudes, and further for providing fault signals if said secondary winding signal voltage value is not within said value range.

2. The system of claim 1 wherein said detection means further comprises a means for sensing the primary winding excitation signal current magnitudes and a means for comparing said primary excitation signal current magnitudes with a value greater than zero and providing signals indicative of the absence of said primary winding excitation signals.

3. A dual active system for controlling an actuator having a displaceable core, comprising:
   first and second electronic controls, each electronic control receiving actuator command signals to displace the actuator core and each including;
   actuator driver means responsive to control signals for displacing the actuator along an axis,
   displacement sensor means configured with said actuator driver means for measuring the magnitude of said actuator displacement, each displacement sensor means includes a linear variable phase transducer (LVPT) having a plurality of first electrical windings for producing magnetic fluxes at different phases in the displaceable core and a secondary electrical winding providing signals indicative of the summed magnetic flux in the core, detector means receiving said sensed signals including means for determining relative phase magnitude between said primary winding excitation signal and said secondary winding signal, and means for computing respective displacement signal values in dependence on each of said relative phase magnitudes,
   displacement sensor failure means for determining a displacement sensor failure, comprising means for sensing said primary winding excitation signal, means for sensing the respective values of voltage and phase of said secondary winding signal, means having associated therewith a plurality of predetermined ranges of signal values corresponding to each of said displacement signal values, for comparing the secondary winding voltage signal voltage value with the corresponding one of said predetermined ranges of signal values, said comparing means capable of formulating each of said value ranges with different magnitudes, and further for generating fault signals if said secondary winding signal voltage value is not within said value range; and
   means associated with said first and second electronic controls for receiving said fault signals and disabling the actuator driver means associated with the one of said controls generating said fault signals and further configuring the non-disabled one of said actuator driver means to displace the actuator core in accordance with said command signals, thereby maintaining normal actuator operation.

4. The system of claim 3 wherein said detection means further comprises a means for sensing the primary winding excitation signal current magnitudes and a means for comparing said primary excitation signal current magnitudes with a value greater than zero and providing signals indicative of the absence of primary winding excitation signals.

* * * * *

UNITED STATES PATENT AND TRADEMARK OFFICE
CERTIFICATE OF CORRECTION

PATENT NO. : 4,841,209
DATED : June 20, 1989
INVENTOR(S) : Demetrius J. Poumakis It is certified that error appears in the above-identified patent and that said Letters Patent is hereby corrected as shown below:

Column 1

Line 27, delete "A" and substitute--An--.
        Line 29, delete "a" and substitute--an--.
        Line 46, delete "cores" and substitute--core's--.
        Line 50, delete "a" and substitute--an--.
        Line 65, delete "circuit" and substitute--circuits--.

Column 2

Line 1, delete "SUMMARY OF INVENTION" and substitute--SUMMARY OF THE INVENTION--.

Column 3

Line 10, delete "diagramatic" and substitute--diagrammatic--.
        Line 15, delete "diagramatic" and substitute--diagrammatic--.
        Line 18, delete "diagramatic" and substitute--diagrammatic--.
        Line 51, delete "a" and substitute--an--.

UNITED STATES PATENT AND TRADEMARK OFFICE
CERTIFICATE OF CORRECTION

PATENT NO. : 4,841,209
DATED : June 20, 1989
INVENTOR(S) : Demetrius J. Poumakis It is certified that error appears in the above-identified patent and that said Letters Patent is hereby corrected as shown below:

Column 4

Line 2, delete "some".
Line 7, delete "A" and substitute--An--.
Line 15, delete "a" and substitute--an--.
Line 18, delete "preferrable" and substitute--preferable--.

Column 5

Line 67, after "92" insert--,--.

Column 6

Line 7, delete "diagramatic" and substitute--diagrammatic--.
Line 12, after "nals" insert--,--.
Line 16, delete "a" and substitute--an--.
Line 21, delete "diagramatic" and substitute--diagrammatic--.
Line 55, delete "continuted" and substitute--continued--.

UNITED STATES PATENT AND TRADEMARK OFFICE
CERTIFICATE OF CORRECTION

PATENT NO. : 4,841,209
DATED : June 20, 1989
INVENTOR(S) : Demetrius J. Poumakis It is certified that error appears in the above-identified patent and that said Letters Patent is hereby corrected as shown below:

In the Abstract

Line 10, after "with" delete "to".

Signed and Sealed this

Twenty-fourth Day of April, 1990

Attest:

HARRY F. MANBECK, JR.

Attesting Officer                Commissioner of Patents and Trademarks